United States Patent
Yu et al.

(10) Patent No.: US 7,233,178 B2
(45) Date of Patent: Jun. 19, 2007

(54) POWER-ON SOLUTION TO AVOID CROWBAR CURRENT FOR MULTIPLE POWER SUPPLIES' INPUTS/OUTPUTS

(75) Inventors: Talee Yu, Shanghai (CN); Hellen Cheng, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 67 days.

(21) Appl. No.: 11/110,655

(22) Filed: Apr. 19, 2005

(65) Prior Publication Data
US 2006/0220706 A1    Oct. 5, 2006

(51) Int. Cl.
*H03K 3/00* (2006.01)
(52) U.S. Cl. .................. 327/112; 327/333; 327/143; 326/57; 326/80
(58) Field of Classification Search ............... None
See application file for complete search history.

(56) References Cited

U.S. PATENT DOCUMENTS

| | | | |
|---|---|---|---|
| 6,278,294 B1 * | 8/2001 | Taniguchi | 326/80 |
| 6,563,353 B2 | 5/2003 | Chen et al. | |
| 6,822,479 B1 * | 11/2004 | Rosen | 326/68 |
| 6,980,035 B1 * | 12/2005 | Zhou et al. | 327/112 |

* cited by examiner

*Primary Examiner*—Tuan T. Lam
(74) *Attorney, Agent, or Firm*—Townsend and Townsend and Crew LLP

(57) ABSTRACT

Techniques to avoid crowbar current are provided. An integrated circuit according to an embodiment of the present invention includes a first node having a first supply voltage level. A first level shift circuit is connected between the first node and a first path. A second level shift circuit is connected between the first node and a second path. The first path includes an even number of inverter stages, while the second path includes an odd number of inverter stages. The first and second level shift circuits are configured to output a signal at the second supply voltage level. The integrated circuit also includes a PMOS transistor and an NMOS transistor connected in series between a second node having the second supply voltage level and a reference voltage. A gate of the PMOS transistor is connected to the first path, and a gate of the NMOS transistor connected to the second path. An I/O pad connected between the PMOS and NMOS transistors has high impedance during a power-on period when the second node is powered up before the first node. In other specific embodiments, the inverter stages of the first path and the second path can be replaced with pull-up or pull-down circuits, respectively.

20 Claims, 4 Drawing Sheets

POWER-ON SOLUTION TO AVOID CROWBAR CURRENT FOR MULTIPLE POWER SUPPLIES' INPUTS/OUTPUTS

BACKGROUND OF THE INVENTION

The present invention is directed to integrated circuits and their processing for the manufacture of semiconductor devices. More particularly, the invention provides a method and device for avoiding crowbar current during power-on of integrated circuits. Merely by way of example, the invention has been applied to input/output (I/O) interfaces with multiple power supplies. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has improved performance and complexity of integrated circuits, but it has also introduced additional design constraints. For example, smaller devices generally require low supply voltages, such as 1.2 volts. However, these smaller devices will sometimes interface or interoperate with larger devices of older technology. In such cases, signals can be level shifted to an appropriate voltage level. That is to say, a signal at a 1.2 volts standard can be level shifted to a 3.3 volts standard, or even 5 volts standard, in order for a circuit of typically older technology to properly work. This introduction of multiple supply voltages can lead to crowbar currents, or currents that flows through a short circuit path from a supply voltage to a ground or another supply voltage. Crowbar currents are generally unwanted as devices can be damaged and excess power drained.

In a conventional integrated circuit having multiple supply voltages, a bus coupled to a plurality of I/O pads is particularly prone to unwanted crowbar current. During power-on, one supply voltage may become available before one or more other supply voltages. For example, I/O supply voltage can be powered up prior to a core supply voltage. In such instances, logic states of the plurality of I/O pads coupled to the bus may be unknown. If there is bus contention (i.e., an I/O pad in a high state, logic 1, is coupled to an I/O pad in a low state, logic 0), a crowbar current can develop from one I/O pad to the other.

From the above, it is seen that techniques to avoid crowbar current are desired.

BRIEF SUMMARY OF THE INVENTION

According to the present invention, techniques directed to integrated circuits are provided. More particularly, the invention provides a method and device for avoiding crowbar current during power-on of integrated circuits. Merely by way of example, the invention has been applied to input/output (I/O) interfaces with multiple power supplies. But it would be recognized that the invention has a much broader range of applicability.

In a specific embodiment, the invention provides an integrated circuit. The integrated circuit includes a first node having a first supply voltage level. A first level shift circuit is connected between the first node and a first path. A second level shift circuit is connected between the first node and a second path. The first path includes an even number of inverter stages, while the second path includes an odd number of inverter stages. The first and second level shift circuits are configured to output a signal at the second supply voltage level. The integrated circuit also includes a PMOS transistor and an NMOS transistor connected in series between a second node having the second supply voltage level and a reference voltage. A gate of the PMOS transistor is connected to the first path, and a gate of the NMOS transistor is connected to the second path. An I/O pad connected between the PMOS and NMOS transistors has high impedance during a power-on period when the second node is powered up before the first node.

In another embodiment, an integrated circuit includes a first node having a first supply voltage level. A first level shift circuit is connected between the first node and a first path. A second level shift circuit is connected between the first node and a second path. The first path includes N, an even number, of inverter stages, while the second path includes N+1 inverter stages. The first and second level shift circuits are configured to output a signal at the second supply voltage level. The integrated circuit also includes a PMOS transistor and an NMOS transistor connected in series between a second node having the second supply voltage level and a reference voltage. A gate of the PMOS transistor is connected to the first path, and a gate of the NMOS transistor is connected to the second path. An I/O pad connected between the PMOS and NMOS transistors has high impedance during a power-on period when the second node is powered up before the first node.

In yet another embodiment, an integrate circuit includes a first node having a first supply voltage level. A first level shift circuit is connected between the first node and a first path. The first level shift circuit configured to output a signal at a second supply voltage level. The first path includes an even number of inverter stages. A second level shift circuit is connected between the first node and a second path. The second level shift circuit is configured to output a signal at the second supply voltage level. A PMOS transistor and an NMOS transistor are connected in series between a second node having the second supply voltage level and a reference voltage. A gate of the PMOS transistor is connected to the first path. A pull down circuit is connected to both the second path and a gate of the NMOS transistor. An I/O pad is connected between the PMOS transistor and the NMOS transistor. The I/O pad is in a high impedance state during a power on period when the second node is powered up before the first node.

In another embodiment, an integrate circuit includes a first node having a first supply voltage level. A first level shift circuit is connected between the first node and a first path. The first level shift circuit is configured to output a signal at a second supply voltage level. A second level shift circuit is connected between the first node and a second path. The second level shift circuit is configured to output a signal at the second supply voltage level. The second path includes an odd number of inverter stages. A PMOS transistor and an NMOS transistor are connected in series between a second node having the second supply voltage level and a reference voltage. A pull-up circuit is connected to both a gate of the PMOS transistor and the first path. A gate of the NMOS transistor is connected to the second path. An I/O pad is connected between the PMOS transistor and the NMOS transistor, the I/O pad being in a high impedance state during a power on period when the second node is powered up before the first node.

Many benefits are achieved by way of the present invention over conventional techniques. For example, the present technique provides an integrated circuit that relies upon conventional technology to manufacture. Additionally, the method provides an integrated circuit that is compatible with conventional process technology without substantial modifications to conventional equipment and processes. Depending upon the embodiment, one or more of these benefits may be achieved. These and other benefits will be described in more throughout the present specification and more particularly below. Various additional objects, features and advantages of the present invention can be more fully appreciated with reference to the detailed description and accompanying drawings that follow.

DETAILED DESCRIPTION OF THE INVENTION

According to the present invention, techniques directed to integrated circuits are provided. More particularly, the invention provides a method and device for avoiding, or substantially reducing, crowbar current. Merely by way of example, the invention has been applied to I/O interfaces for integrated circuits with multiple power supplies. But it would be recognized that the invention has a much broader range of applicability.

Figure 1A:
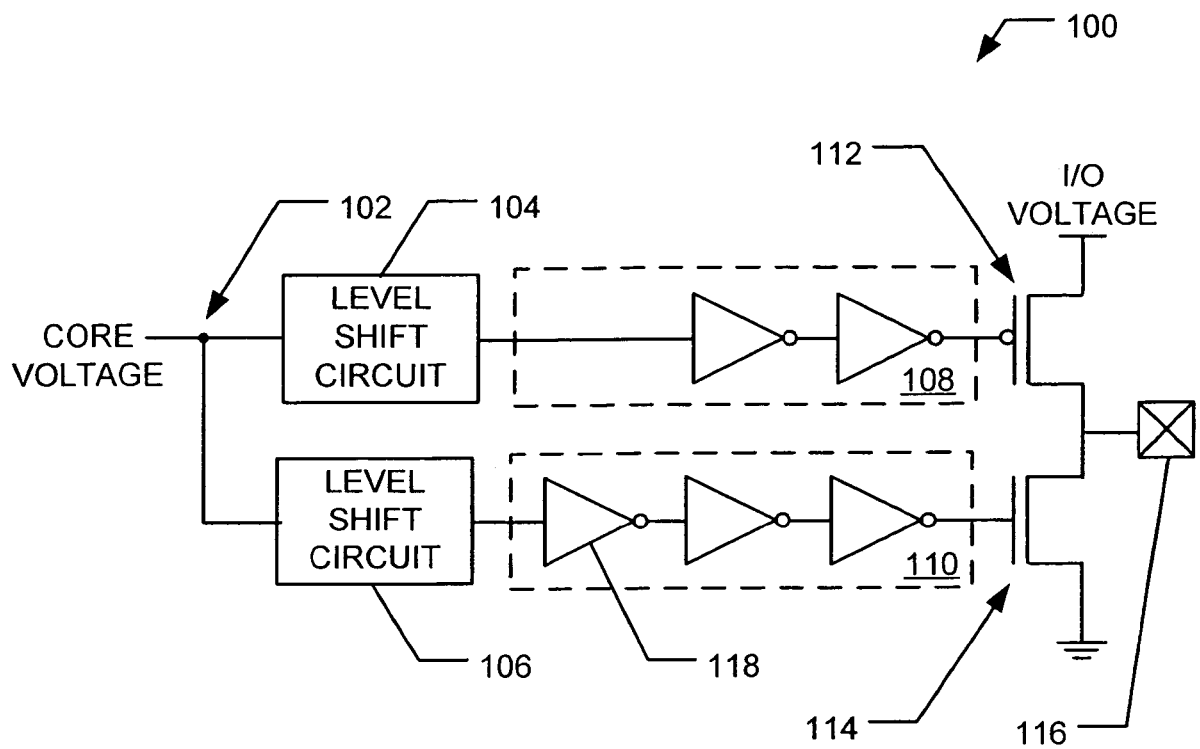
FIG. 1A is a simplified schematic of an integrated circuit according to an embodiment of the present invention.

FIG. 1A is a simplified schematic of an integrated circuit 100 according to an embodiment of the present invention. This diagram is merely an example, which should not unduly limit the scope of the claims. One of ordinary skill in the art would recognize many variations, alternatives, and modifications. Integrated circuit 100 includes a node 102 at a core voltage, or a first supply voltage level. Upon power-on, core voltage increases over a short period of time from 0 volts to a predetermined voltage. In one embodiment, the predetermined voltage is 1.2 volts. In other embodiments, core voltage may be any arbitrary voltage, such as any conventional voltage standard (e.g., 5 volts, 3.3 volts, 3 volts, 2.5 volts, 1.8 volts, and 1.5 volts).

Level shift circuits 104 and 106 are coupled to node 102. Level shift circuits 104 and 106 shift an input signal, in this case core voltage at node 102, from a first voltage level to a second voltage level. For example, core voltage from node 102 is inputted into level shift circuit 104, and level shift circuit 104 outputs a signal at the I/O voltage standard. During power-on when core power remains low, outputs of the level shift circuits 104 and 106 are at least at a threshold voltage ($V_T$) for an NMOS transistor and less than (or equal to) I/O voltage, or otherwise "high." Based on the teachings contained herein, one of ordinary skill in the art will know how to implement level shift circuits 104 and 106.

Level shift circuits 104 and 106 are respectively coupled to a first path 108 and a second path 110. The first path 108 includes an even number of inverter stages, while second path 110 includes an odd number of inverter stages. The first path 108 is coupled to a gate of a PMOS transistor 112. The second path 110 is coupled to a gate of an NMOS transistor 114. PMOS transistor 112 and NMOS transistor 114 are coupled in series between a second node at I/O voltage and a reference voltage. In a specific embodiment, I/O voltage is 3.3 volts. In alternative embodiments, I/O voltage can be any arbitrary voltage, such as any conventional standard (e.g., 5 volts, 3.3 volts, 3 volts, 2.5 volts, 1.8 volts, and 1.5 volts). In an embodiment of the present invention, I/O voltage exceeds core voltage. The reference voltage can be any voltage; however, in a specific embodiment, the reference voltage is a ground potential.

As illustrated in FIG. 1A, an I/O pad 116 can be coupled between the PMOS transistor 112 and the NMOS transistor 114. I/O pad 116 is in a high impedance state during a power-on period when I/O voltage is powered up before core voltage at node 102. The high impedance state is accomplished by having both PMOS transistor 112 and NMOS transistor 114 in an "off" state (i.e., a substantially non-conductive state). That is to say, when node 102 is at about 0 volts (or otherwise well below its final predetermined voltage level), the output of the first path 108 is at a "high" voltage and thus ensures PMOS transistor 112 is "off", and the output of the second path 110 is at a "low" voltage and thus ensures NMOS transistor 114 is also "off." During the high impedance state, I/O pad 116 may have an impedance of at least about 100K ohms.

Figure 1B:
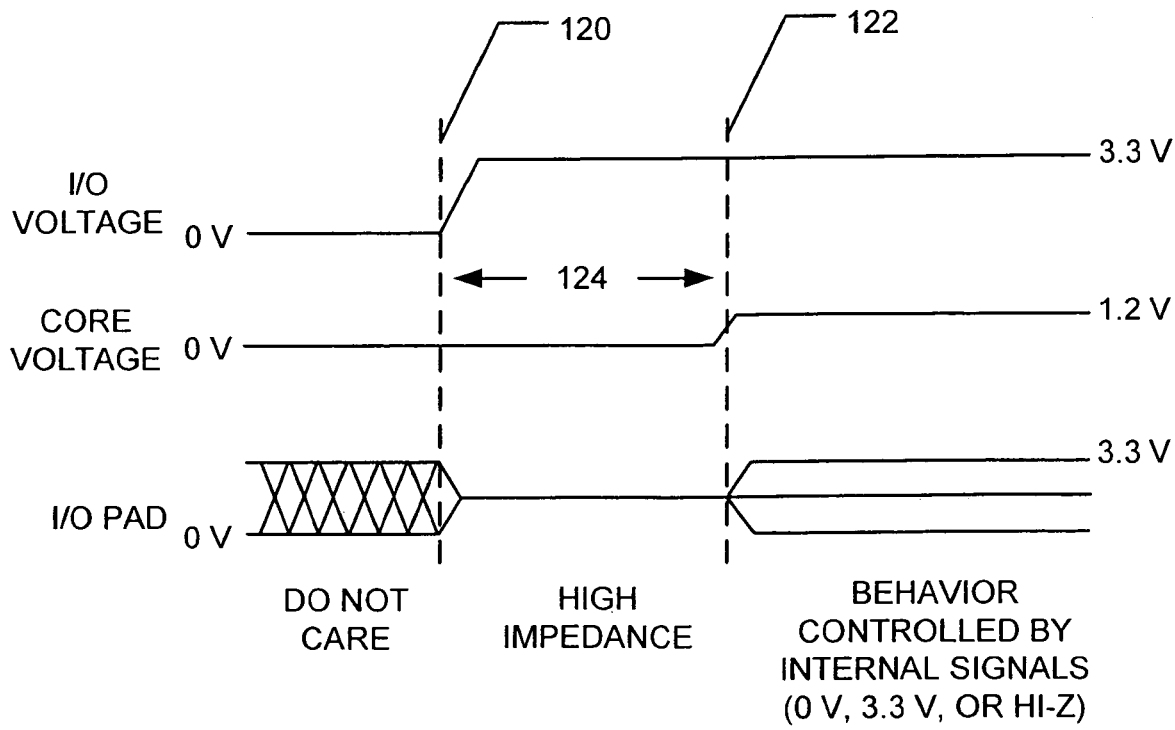
FIG. 1B is a simplified timing chart illustrating an embodiment of the present invention.

FIG. 1B is a simplified timing chart illustrating an embodiment of the present invention. During a power-on event at time 120, I/O voltage begins to ramp to its predetermined voltage level of 3.3 volts. As can be seen from FIG. 1B, there is a delay of time period 124 before core voltage ramps to its predetermined voltage level of 1.2 volts. Time period 124 can typical range from about 10 nanoseconds to about 10 milliseconds, or more. For conventional integrated circuits, during a period corresponding to period 124, unwanted crowbar currents can develop because of unpredictable transistor states prior to power-up of all power supply voltages. In an embodiment of the present invention, I/O pads have high impedance during period 124. Crowbar currents are avoided, or at least substantially reduced.

Figure 2A:
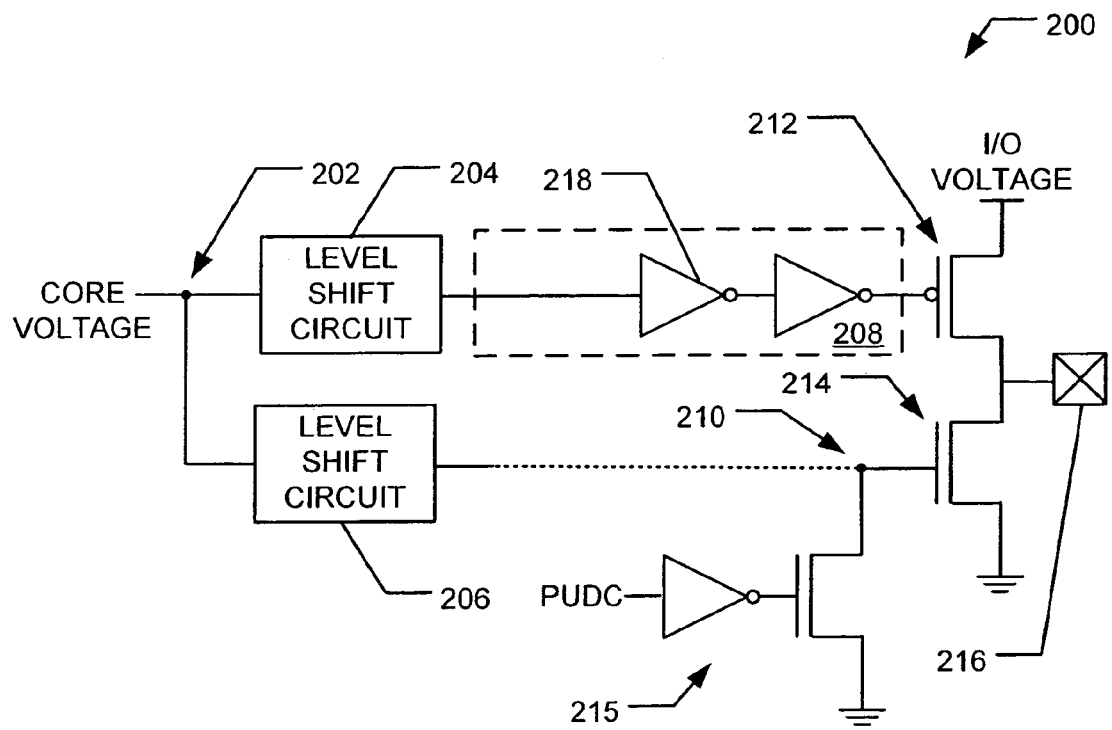
FIG. 2A a simplified schematic of an integrated circuit according to an embodiment of the present invention.

FIG. 2A a simplified schematic of an integrated circuit 200 according to another embodiment of the present invention. This diagram is merely an example, which should not unduly limit the scope of the claims. One of ordinary skill in the art would recognize many variations, alternatives, and modifications. Integrated circuit 200 includes a node 202 at a core voltage, or a first supply voltage level. Upon power-on, core voltage increases over a short period of time from 0 volts to a predetermined voltage. In one embodiment, the predetermined voltage is 1.2 volts. In other embodiments, core voltage may be any arbitrary voltage, such as any conventional voltage standard (e.g., 5 volts, 3.3 volts, 3 volts, 2.5 volts, 1.8 volts, and 1.5 volts).

Level shift circuits 204 and 206 are coupled to node 202. Level shift circuits 204 and 206 shift an input signal from a first voltage level to a second voltage level. Level shift circuit 204 is coupled to a first path 208. The first path 208 includes an even number of inverter stages 218, and is coupled to a gate of a PMOS transistor 212. Level shift circuit 206 is coupled at node 210 to a gate of an NMOS transistor 214 and to a pull-down circuit 215. In alternative embodiments, there can be a number of intervening devices between level shift circuit 206 and node 210. PMOS transistor 212 and NMOS transistor 214 are coupled in series between a node at I/O voltage and a reference voltage. In a specific embodiment, I/O voltage is 3.3 volts. In alternative embodiments, I/O voltage can be any arbitrary voltage, such as any conventional standard (e.g., 5 volts, 3.3 volts, 3 volts, 2.5 volts, 1.8 volts, and 1.5 volts). Similarly, the reference voltage can any voltage; however, in a specific embodiment, the reference voltage is a ground potential.

As illustrated in FIG. 2A, an I/O pad 216 can be coupled between the PMOS transistor 212 and the NMOS transistor 214. I/O pad 216 is in a high impedance state during a power-on period when I/O voltage is powered up before core voltage at node 202. The high impedance state is accomplished by having both PMOS transistor 212 and NMOS transistor 214 in an off state. The operation of NMOS transistor 214 can be controlled by pull-down circuit 215, which in turn is controlled by signal PUDC (power on detect circuit signal). When PUDC is low, or logic "0", a transistor of the pull-down circuit brings node 210 to a low potential voltage ensuring NMOS transistor 214 is turned off.

Figure 2B:
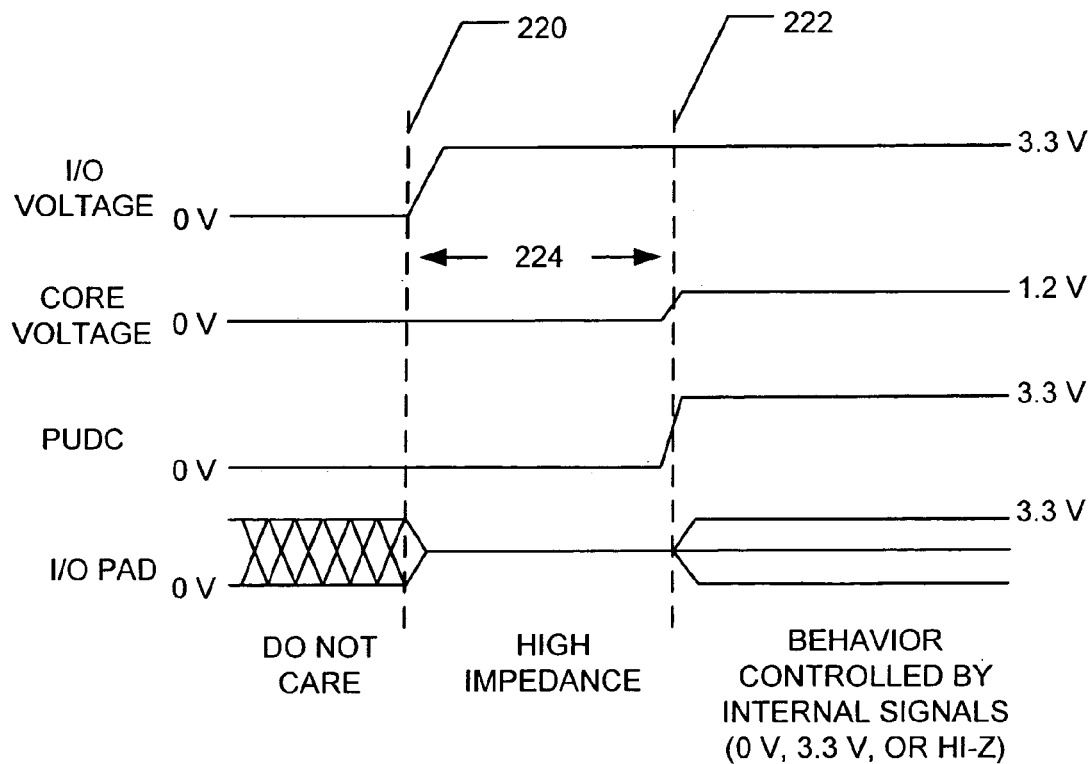
FIG. 2B is a simplified timing chart illustrating an embodiment of the present invention.

FIG. 2B is a simplified timing chart illustrating an embodiment of the present invention. During a power-on event at time 220, I/O voltage begins to ramp to its predetermined voltage level of 3.3 volts. As can be seen from FIG. 1B, there is a delay of time period 224 for core voltage to ramp to its predetermined voltage level of 1.2 volts. Time period 224 can typical range from about 10 nanoseconds to about 10 milliseconds, or more. During period 224, signal PUDC is asserted low to ensure NMOS transistor 214 is off and non-conductive. PMOS transistor 212 remains off since the output of path 208 remains high. As both PMOS transistor 212 and NMOS transistor 214 are off, I/O pad 216 has high impedance during period 224. Crowbar currents is avoided, or at least substantially reduced.

Figure 3:
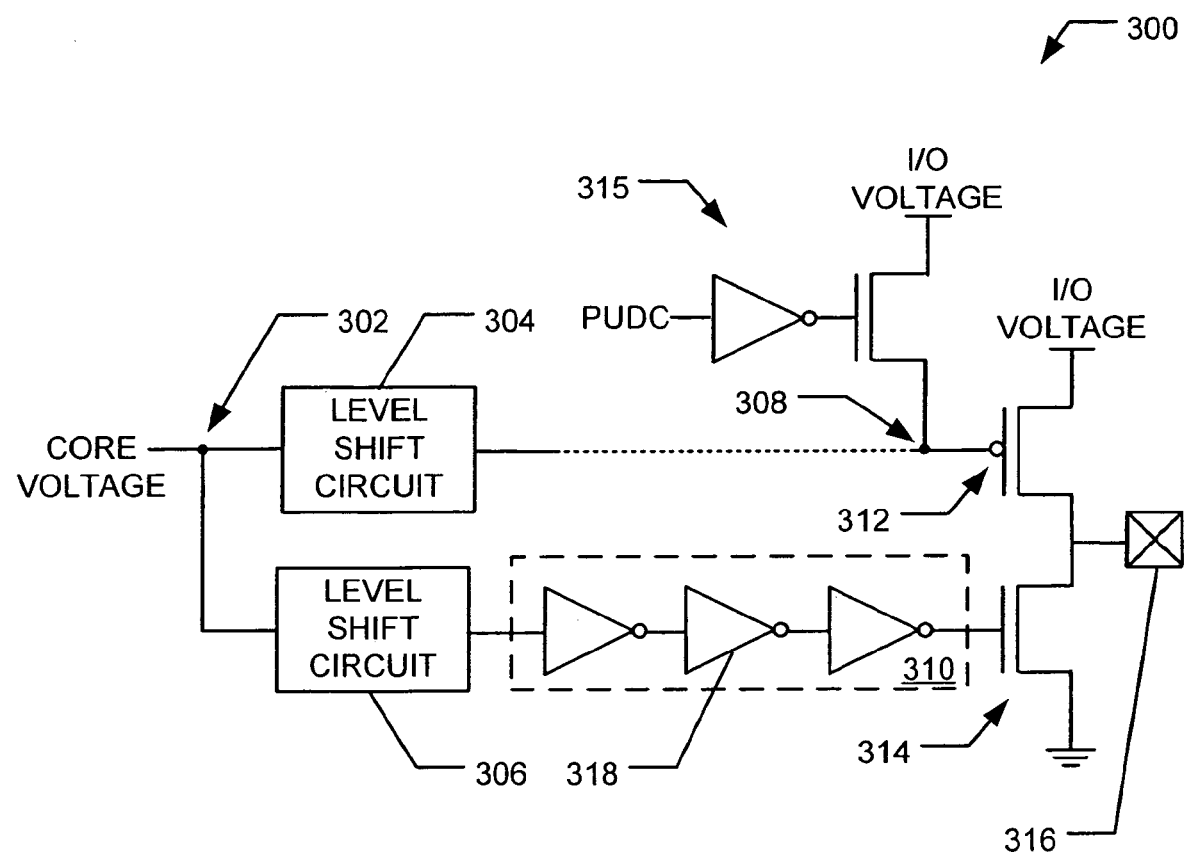
FIG. 3 is simplified schematic of an integrated circuit according to an embodiment of the present invention.

FIG. 3 is simplified schematic of an integrated circuit 300 according to yet another embodiment of the present invention. This diagram is merely an example, which should not unduly limit the scope of the claims. One of ordinary skill in the art would recognize many variations, alternatives, and modifications. Integrated circuit 300 includes level shift circuits 304 and 306 branched at node 302. Level shift circuit 306 is coupled to a path 310 that includes an odd number of inverter stages 318. Path 310 couples to the gate of NMOS transistor 314. When core voltage at node 302 is low during a power-on, the output of path 310 is also low, whereby NMOS transistor 314 is off. Level shift circuit 304 is coupled to a gate of a PMOS transistor 312 and a pull-up circuit 315 at node 308. In alternative embodiments, there can be a number of intervening devices between level shift circuit 304 and node 308. Pull-up circuit 315 is also coupled to I/O voltage. When signal PUDC is asserted low (e.g., during a time period core voltage has not sufficiently ramped to its predetermined voltage level), pull-up circuit 315 brings node 308 up to or about I/O voltage. PMOS transistor 312 is off while node 308 is high. Crowbar current from I/O pad 316 is eliminated, or substantially reduced, during power-on if both PMOS transistor 312 and NMOS transistor 314 are off.

Figure 4:
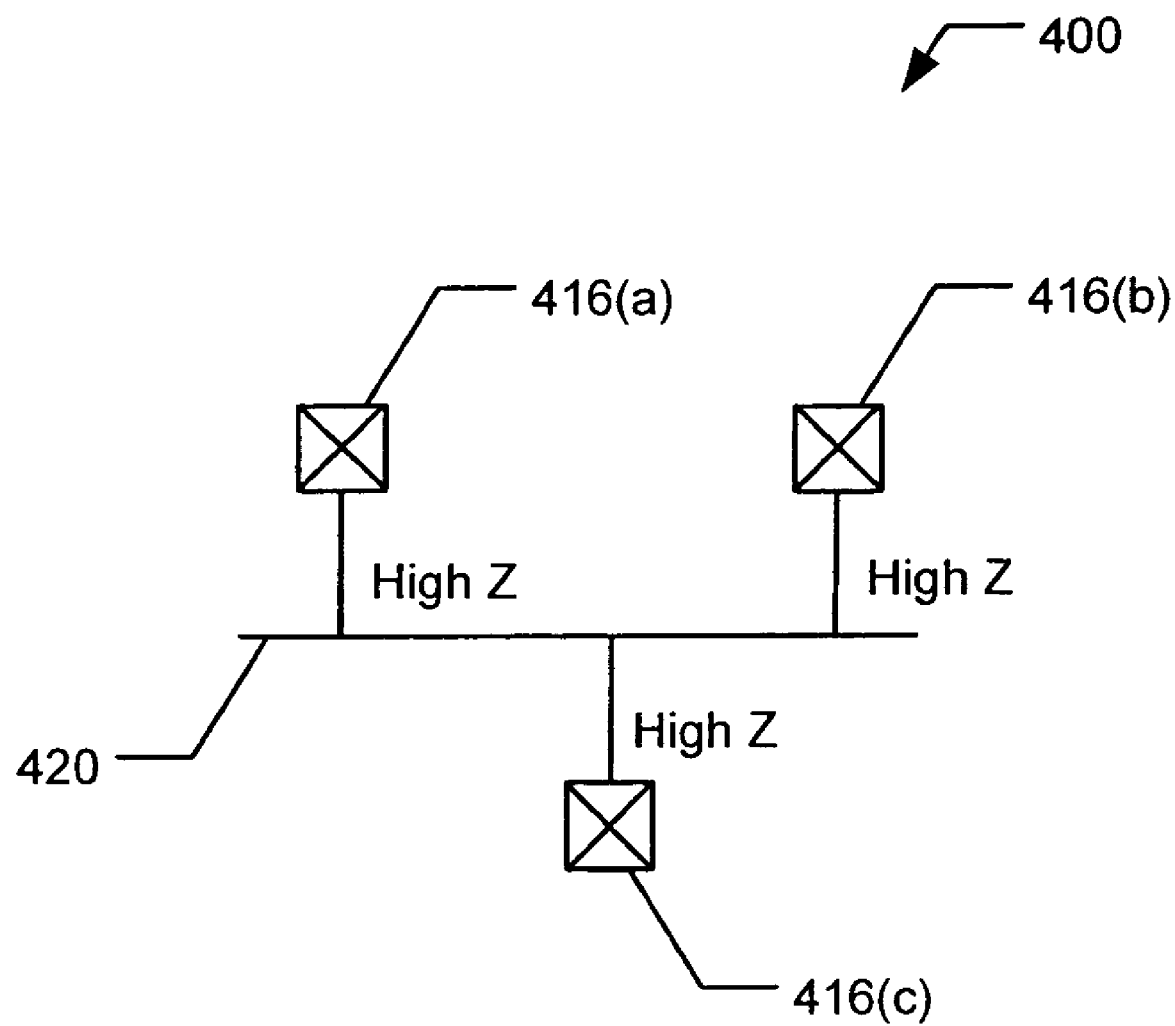
FIG. 4 shows a simplified bus during power-on according to an embodiment of the present invention.

FIG. 4 shows a simplified bus coupled to I/O pads during power-on according to an embodiment of the present invention. This diagram is merely an example, which should not unduly limit the scope of the claims. One of ordinary skill in the art would recognize many variations, alternatives, and modifications. Integrated circuit 400 includes a bus 420 and I/O pads 416(a)–416(c). Bus 420 can be any net, interconnection, transmission path, or data path. Bus 420 is coupled to each of I/O pads 416(a)–416(c), and thus each of these I/O pads are electrically coupled to other I/O pads. Bus contention, and the resulting crowbar current, can arise if two or more I/O pads attempt to drive bus 420 to differing voltages level (i.e., logic 1 or logic 0). In an embodiment of the present invention, each I/O pad is placed in a high impedance state during power-on, which avoids bus contention.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrate circuit comprising:
    a first node having a first supply voltage level;
    a first level shift circuit coupled between the first node and a first path, the first level shift circuit configured to output a signal at a second supply voltage level, and the first path including an even number of inverter stages;
    a second level shift circuit coupled between the first node and a second path, the second level shift circuit configured to output a signal at the second supply voltage level, and the second path including an odd number of inverter stages;
    a PMOS transistor and an NMOS transistor coupled in series between a second node having the second supply voltage level and a reference voltage;
    a gate of the PMOS transistor coupled to the first path;
    a gate of the NMOS transistor coupled to the second path;
    an I/O pad coupled between the PMOS transistor and the NMOS transistor, the I/O pad being in a high impedance state during a power-on period when the first supply voltage level is powered up before the second supply voltage level.

2. The integrated circuit of claim 1 wherein the first supply voltage level is less than the second power supply voltage level.

3. The integrated circuit of claim 1 wherein the first power supply voltage level is 1.2 volts.

4. The integrated circuit of claim 1 wherein the second power supply voltage level is 3.3 volts.

5. The integrated circuit of claim 1 wherein the power-on period is less than about 10 milliseconds.

6. The integrated circuit of claim 1 wherein the even number of inverter stages is 2, and the odd number of inverter stages is 3.

7. The integrated circuit of claim 1 wherein the reference voltage is a ground potential.

8. The integrated circuit of claim 1 wherein the high impedance state has an impedance of at least about 100K ohms.

9. The integrated circuit of claim 1 further comprising:
    a third node having the first supply voltage level;
    a third level shift circuit coupled between the third node and a third path, the third level shift circuit configured to output a signal at the second supply voltage level, and the third path including an even number of inverter stages;
    a fourth level shift circuit coupled between the third node and a fourth path, the fourth level shift circuit configured to output a signal at the second supply voltage level, and the fourth path including an odd number of inverter stages;
    a second PMOS transistor and a second NMOS transistor coupled in series between the second node having the second supply voltage level and the reference voltage;

a gate of the second PMOS transistor coupled to the third path;
a gate of the second NMOS transistor coupled to the fourth path;
a second I/O pad coupled between the second PMOS transistor and the second NMOS transistor, the I/O pad and the second I/O pad being coupled via a bus, the second I/O pad being in a high impedance state during the power-on period.

10. An integrate circuit comprising:
a first node having a first supply voltage level;
a first level shift circuit coupled between the first node and a first path, the first level shift circuit configured to output a signal at a second supply voltage level, and the first path including N inverter stages, N being an even number;
a second level shift circuit coupled between the first node and a second path, the second level shift circuit configured to output a signal at the second supply voltage level, and the second path including N+1 inverter stages;
a PMOS transistor and an NMOS transistor coupled in series between a second node having the second supply voltage level and a reference voltage;
a gate of the PMOS transistor coupled to the first path;
a gate of the NMOS transistor coupled to the second path;
an I/O pad coupled between the PMOS transistor and the NMOS transistor, the I/O pad being in a high impedance state during a power-on period when the second node is powered up before the first node.

11. An integrate circuit comprising:
a first node having a first supply voltage level; a first level shift circuit coupled between the first node and a first path, the first level shift circuit configured to output a signal at a second supply voltage level, and the first path including an even number of inverter stages;
a second level shift circuit coupled between the first node and a second path, the second level shift circuit configured to output a signal at the second supply voltage level;
a PMOS transistor and an NMOS transistor coupled in series between a second node having the second supply voltage level and a reference voltage;
a gate of the PMOS transistor coupled to the first path;
a pull down circuit coupled to both the second path and a gate of the NMOS transistor;
an I/O pad coupled between the PMOS transistor and the NMOS transistor, the I/O pad being in a high impedance state during a power-on period when the second node is powered up before the first node.

12. The integrated circuit of claim 11 wherein the first supply voltage level is less than the second power supply voltage level.

13. The integrated circuit of claim 11 wherein the first power supply voltage level is 1.2 volts.

14. The integrated circuit of claim 11 wherein the second power supply voltage level is 3.3 volts.

15. The integrated circuit of claim 11 wherein the power-on period is less than about 10 milliseconds.

16. The integrated circuit of claim 11 wherein the power-on period ranges from about 10 nanoseconds to about 10 milliseconds.

17. The integrated circuit of claim 11 wherein the even number of inverter stages is 2.

18. The integrated circuit of claim 11 wherein the reference voltage is a ground potential.

19. The integrated circuit of claim 11 wherein the high impedance state has an impedance of at least about 100K ohms.

20. An integrate circuit comprising:
a first node having a first supply voltage level;
a first level shift circuit coupled between the first node and a first path, the first level shift circuit configured to output a signal at a second supply voltage level;
a second level shift circuit coupled between the first node and a second path, the second level shift circuit configured to output a signal at the second supply voltage level, and the second path including an odd number of inverter stages;
a PMOS transistor and an NMOS transistor coupled in series between a second node having the second supply voltage level and a reference voltage;
a pull-up circuit coupled to both a gate of the PMOS transistor and the first path;
a gate of the NMOS transistor coupled to the second path;
an I/O pad coupled between the PMOS transistor and the NMOS transistor, the I/O pad being in a high impedance state during a power-on period when the second node is powered up before the first node.

* * * * *